United States Patent
Tominaga et al.

(10) Patent No.: US 7,592,274 B2
(45) Date of Patent: Sep. 22, 2009

(54) METHOD FOR FABRICATING SEMICONDUCTOR ELEMENT

(75) Inventors: Tetsumi Tominaga, Miyazaki (JP); Teruhisa Fukuda, Miyazaki (JP)

(73) Assignee: Oki Semiconductor Co., Ltd., Tokyo (JP)

(*) Notice: Subject to any disclaimer, the term of this patent is extended or adjusted under 35 U.S.C. 154(b) by 225 days.

(21) Appl. No.: 11/529,291

(22) Filed: Sep. 29, 2006

(65) Prior Publication Data

US 2008/0081435 A1 Apr. 3, 2008

(51) Int. Cl.
H01L 21/00 (2006.01)
H01L 21/20 (2006.01)
(52) U.S. Cl. ............... 438/799; 438/382; 438/795; 257/E21.324
(58) Field of Classification Search ............ 438/382, 438/384, 540, 795, 799; 257/E21.077, E21.324
See application file for complete search history.

(56) References Cited

U.S. PATENT DOCUMENTS 7,368,400 B2 * 5/2008 Shin .................. 438/770

2004/0224477 A1 * 11/2004 Erokhin et al. .......... 438/407

FOREIGN PATENT DOCUMENTS

| JP | 06-188413 | 7/1994 |
| JP | 08-116053 | 5/1996 |
| JP | 2001-148481 | 5/2001 |

* cited by examiner

Primary Examiner—Alexander G Ghyka
Assistant Examiner—Seahvosh J Nikmanesh
(74) Attorney, Agent, or Firm—Rabin & Berdo, PC

(57) ABSTRACT

A method for fabricating a semiconductor element includes the steps of: providing a semiconductor wafer; forming an oxide layer on the semiconductor wafer; carrying out a high-temperature thermal treatment to the semiconductor wafer at least once, wherein the high-temperature thermal treatment comprises a final high-temperature treatment, which is carried out lastly as the high-temperature thermal treatment; lowering a temperature of the semiconductor wafer, following the final high-temperature treatment, to a predetermined lower temperature; and exposing the semiconductor wafer to an oxidizing atmosphere after the temperature lowering process.

13 Claims, 7 Drawing Sheets

METHOD FOR FABRICATING SEMICONDUCTOR ELEMENT

TECHNICAL FIELD OF THE INVENTION

This invention relates to a semiconductor integrated circuit, and more particularly to, a method for fabricating a semiconductor element, such as a resistive element.

BACKGROUND OF THE INVENTION

In general, a resistive element to be used in a semiconductor integrated circuit is fabricated by a process including the steps of ion implantation of impurity into a semiconductor wafer; and a thermal treatment, for example, annealing, to activate it. For instance, boron is implanted into a semiconductor Si wafer through the screen oxide layer. Next, annealing process is carried out to the wafer to form a P-type diffused resistor.

However, according to a conventional method, a variety of electric charge is trapped between a screen oxide layer and a semiconductor wafer, and therefore, a surface potential of the semiconductor wafer may be changed. As a result, characteristics of a diffused resistor formed on the semiconductor wafer are fluctuated. Such a fluctuation is caused by electric charge trapped between a screen oxide layer and a semiconductor wafer. This kind of problem is remarkable for a high-resistivity element.

Since electric charge is trapped on a side of an oxide layer, such electric charge can be removed by removing the oxide layer with hydrofluoric acid. However, another electric charge is generated in following thermal treatments. Conventional technology relating to a density of electric charge is described in a reference, J. Electrochem. Soc: SOLID STATE SCIENCE, March 1967, pp 266-273, and J. Electrochem. Soc: SOLID STATE SCIENCE, September 1971, pp 1463-1468.

OBJECTS OF THE INVENTION

Accordingly, an object of this invention is to provide an improved method for fabricating a semiconductor element, having a lower density of electric charge on a semiconductor wafer.

Another object of this invention is to provide an improved method for fabricating a semiconductor element, having a stable density of electric charge on a semiconductor wafer.

Still another object of this invention is to provide an improved method for fabricating a semiconductor element, which does not lower a throughput of the semiconductor element.

Additional objects, advantages and novel features of this invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

The inventor of this invention found out that a density of electric charge, which is trapped at an interface between a semiconductor wafer and an oxide layer, may be fluctuated due to locations in a furnace. Also, a density of electric charge, which is trapped at an interface between a semiconductor wafer and an oxide layer, may be fluctuated due to how wafers are unloaded from a furnace after a high-temperature thermal treatment that is carried out lastly.

According to a first aspect of this invention, a method for fabricating a semiconductor element comprises the steps of: providing a semiconductor wafer; forming an oxide layer on the semiconductor wafer; carrying out a high-temperature thermal treatment to the semiconductor wafer at least once, wherein the high-temperature thermal treatment comprises a final high-temperature treatment, which is carried out lastly as the high-temperature thermal treatment; lowering a temperature of the semiconductor wafer, following the final high-temperature treatment, to a predetermined lower temperature; and exposing the semiconductor wafer in an oxidizing atmosphere after the temperature lowering process.

According to a second aspect of this invention, a method for fabricating a resistive element on a semiconductor wafer comprise the steps of providing a semiconductor wafer; forming a screen oxide layer on the semiconductor wafer; forming a diffusion layer on the semiconductor wafer by ion implantation and a first annealing process; loading the semiconductor wafer into a furnace; carrying out a final high-temperature treatment, which is carried out lastly as a high-temperature thermal treatment in the furnace; lowering a temperature of the semiconductor wafer in the furnace, following the final high-temperature treatment, to a predetermined lower temperature; and unloading the semiconductor wafer from the furnace after the temperature lowering process.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of this inventions. The following detailed description is, therefore, not to be taken in a limiting sense, and scope of this inventions is defined only by the appended claims.

Figure 1:
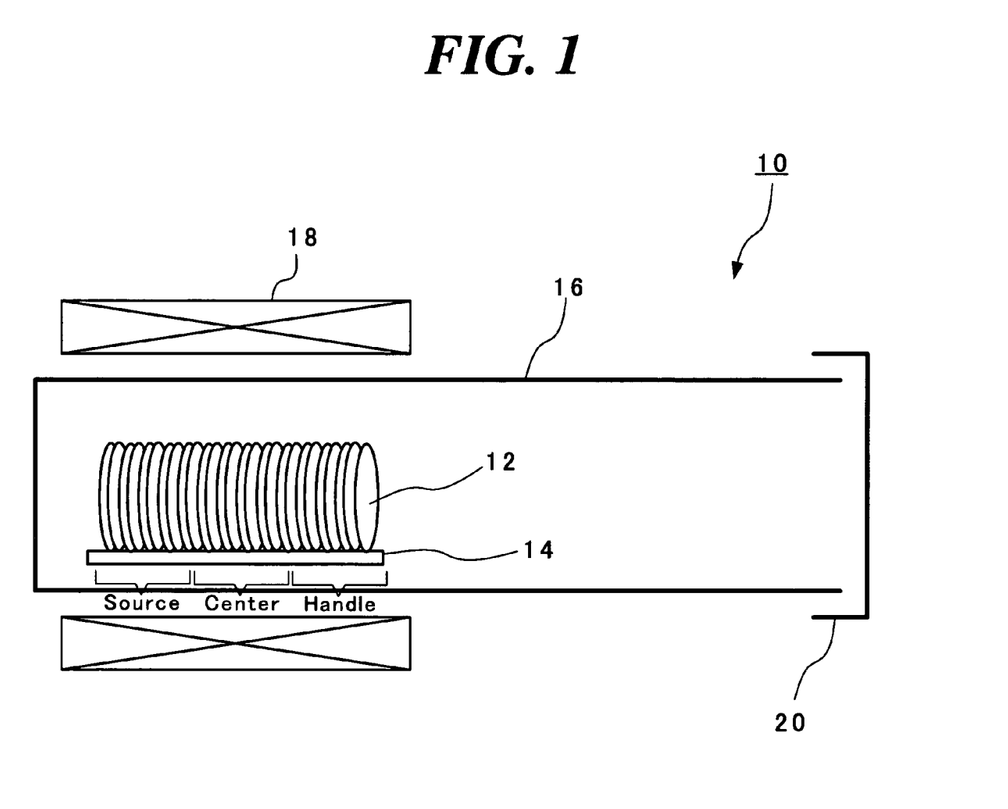
FIG. 1 is a schematic diagram illustrating a furnace which is applicable to this invention.

First of all, referring to FIG. 1, a furnace 10 includes a quartz tube 16, in which semiconductor wafers 12 set on a wafer boat 14 are loaded for thermal treatment. The furnace 10 also includes a heater 18 to heat the semiconductor wafers 12 loaded in the quartz tube 16, and a quartz cap 20 to seal a load/unload opening of the quartz tube 16. For easy understanding, in the quartz tube 16, an area where the deepest part of the semiconductor wafers are located is called "source"; an area where the front most part of the semiconductor wafers are located is called "handle"; and an area located between the "source" and "handle" is called "center", as shown in FIG. 1.

Figure 2:
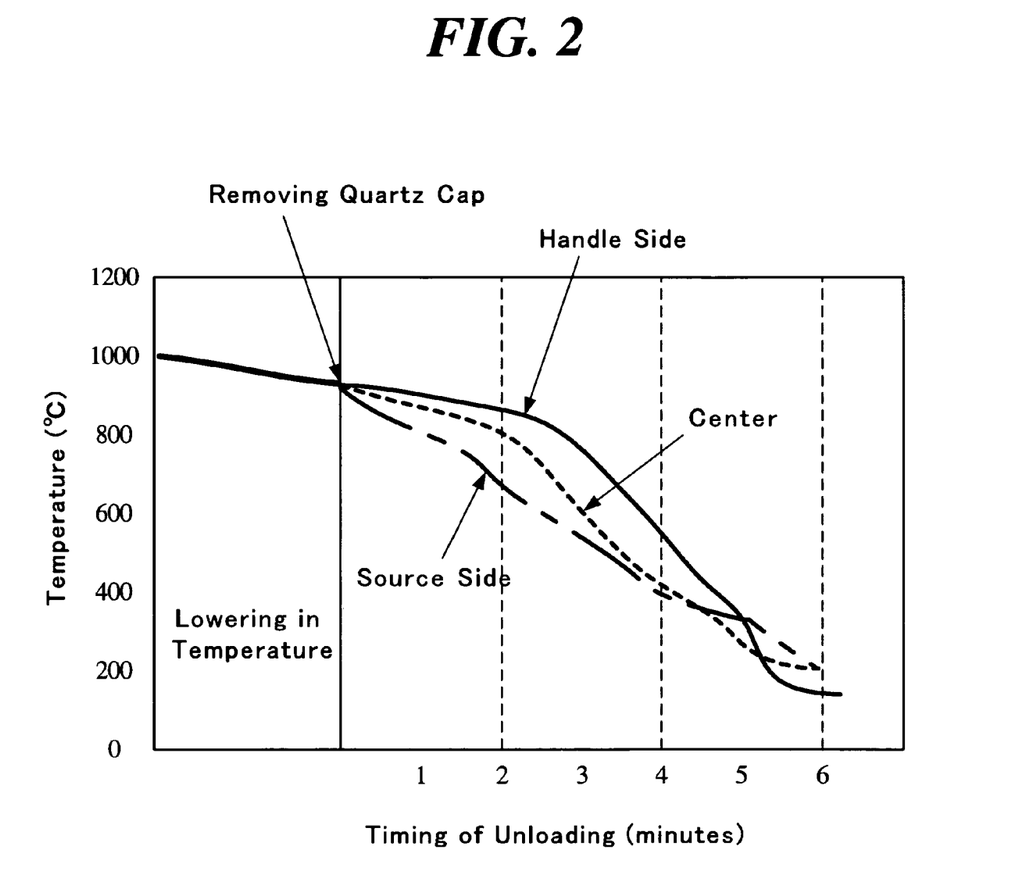
FIG. 2 is a graph showing the relation between a timing of unloading of a semiconductor wafer from a furnace and a temperature thereof.

FIG. 2 is a graph showing the relation between a timing of unloading of a semiconductor wafer from the furnace 10 and a temperature thereof. In FIG. 2, "Timing of Unloading" represents a period of time measured since the quartz cap 20 is removed until the semiconductor wafers are unloaded from the quartz tube 16. According to FIG. 2, the quartz cap 16 is removed when the semiconductor wafers 12 are lowered in temperature from 1000 degrees to 900 degrees.

During a period of time for lowering temperature, the semiconductor wafers 12 have almost the same temperature throughout any locations of "Source Side", "Center" and "Handle Side". When the quartz cap 20 is removed from the quartz tube 16, atmospheric air is introduced into the quartz tube 16, so that temperature difference is made throughout the locations "Source Side", "Center" and "Handle Side" of the semiconductor wafers 12. Since the semiconductor wafers 12 at handle side are located relatively closer to the quartz cap 20, which can be said an opening of the quartz tube 16, the semiconductor wafers 12 at handle side are cooled down quicker than those located at the source side and the center.

For instance, a screen oxide layer having a thickness of 1000 Å is formed on a semiconductor Si wafer by a thermal oxidation process in a wet-$O_2$ atmosphere at 1100° C. The screen oxide layer suppresses channeling phenomenon in an ion implantation. Next, boron (acceptor) is ion-implanted into the semiconductor Si wafer under condition of 150 KeV, 1.2E13 ions/cm$^2$. Subsequently, the semiconductor wafer is annealed under condition of annealing temperature: 1100° C., process time: 20 min, and atmosphere: $N_2$ to form a P-type diffusion layer having a resistance value of 3.5 kohm/sq. Electric charge is trapped at an interface between the semiconductor Si wafer and the screen oxide layer.

Figure 3:
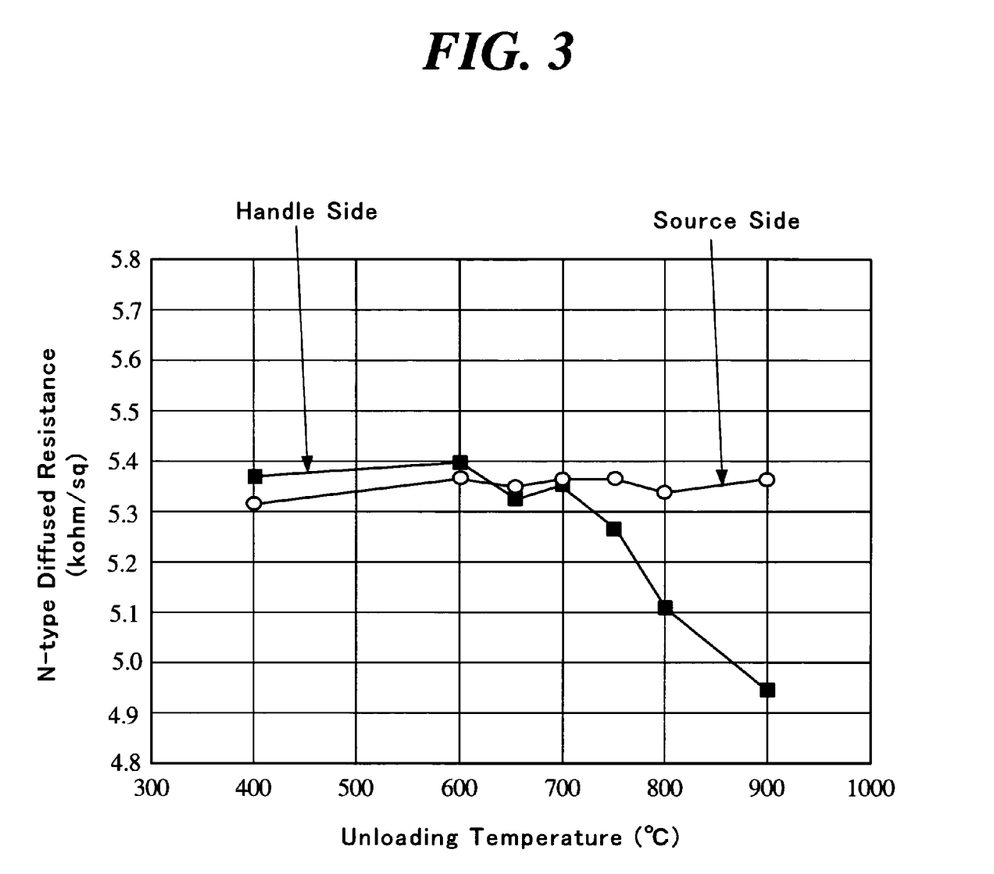
FIG. 3 is a graph showing the relation between a temperature of a wafer in an unloading process and an N-type diffused resistance.

FIG. 3 is a graph showing the relation between a temperature of a wafer when unloaded and an N-type diffused resistance, formed on the semiconductor wafer. Fixed electric charge trapped at an interface between the semiconductor Si wafer and the screen oxide layer operates as a positive electric charge, so that an N-type diffused resistance formed on the semiconductor wafer becomes lower when an unloading temperature is higher than 700° C. or 600° C., as shown in FIG. 3. This kind of result is remarkable to semiconductor wafers located at the handle side in the furnace 10.

Figure 4:
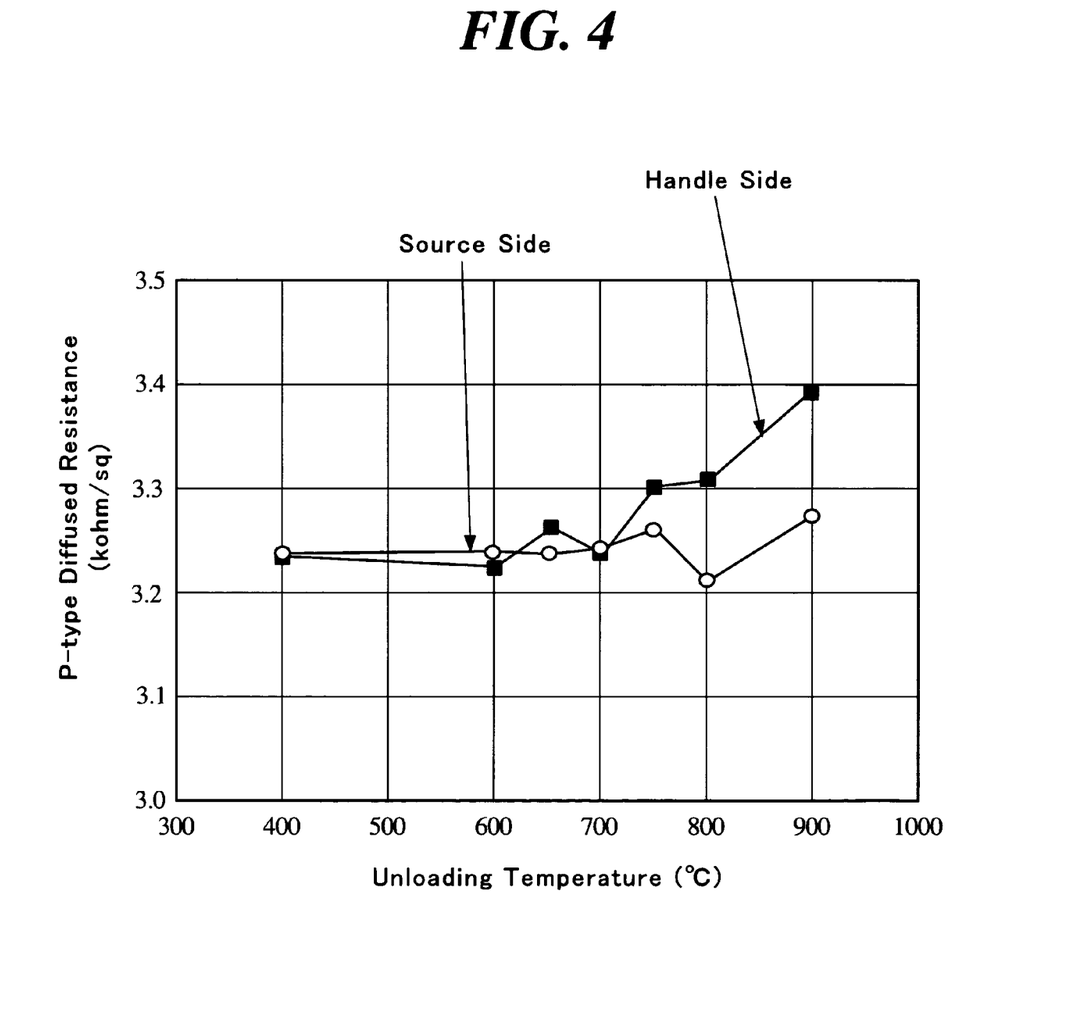
FIG. 4 is a graph showing the relation between a temperature of a wafer in an unloading process and a P-type diffused resistance.

FIG. 4 is a graph showing the relation between a temperature of a wafer when unloaded and a P-type diffused resistance, formed on the semiconductor wafer. Fixed electric charge trapped at an interface between the semiconductor Si wafer and the screen oxide layer operates as a positive electric charge, so that a P-type diffused resistance formed on the semiconductor wafer becomes higher when an unloading temperature is higher than 700° C. or 600° C., as shown in FIG. 4. This kind of result is remarkable to semiconductor wafers located at the handle side in the furnace 10.

According to this invention, a high-temperature thermal treatment is carried out to the semiconductor wafers 12 at least once. The high-temperature thermal treatment includes a final high-temperature treatment, which is carried out lastly among the high-temperature thermal treatment(s). Following the final high-temperature treatment, the temperature of the semiconductor wafers 12 is lowered to a predetermined lower temperature. After the temperature lowering process, the semiconductor wafers 12 are unloaded from the furnace 10 and exposed in an oxidizing atmosphere.

The high-temperature thermal treatment may be carried out plural times at 700° C. or over, preferably over 1000° C. The predetermined lower temperature may be 700° C. or lower, preferably lower than 600° C. This determination is based on the facts show in FIGS. 2-4. The final high-temperature treatment may be carried out intentionally to reduce an electric charge trapped between the oxide layer and the semiconductor wafer. The semiconductor element may include a resistive element.

Figure 5:
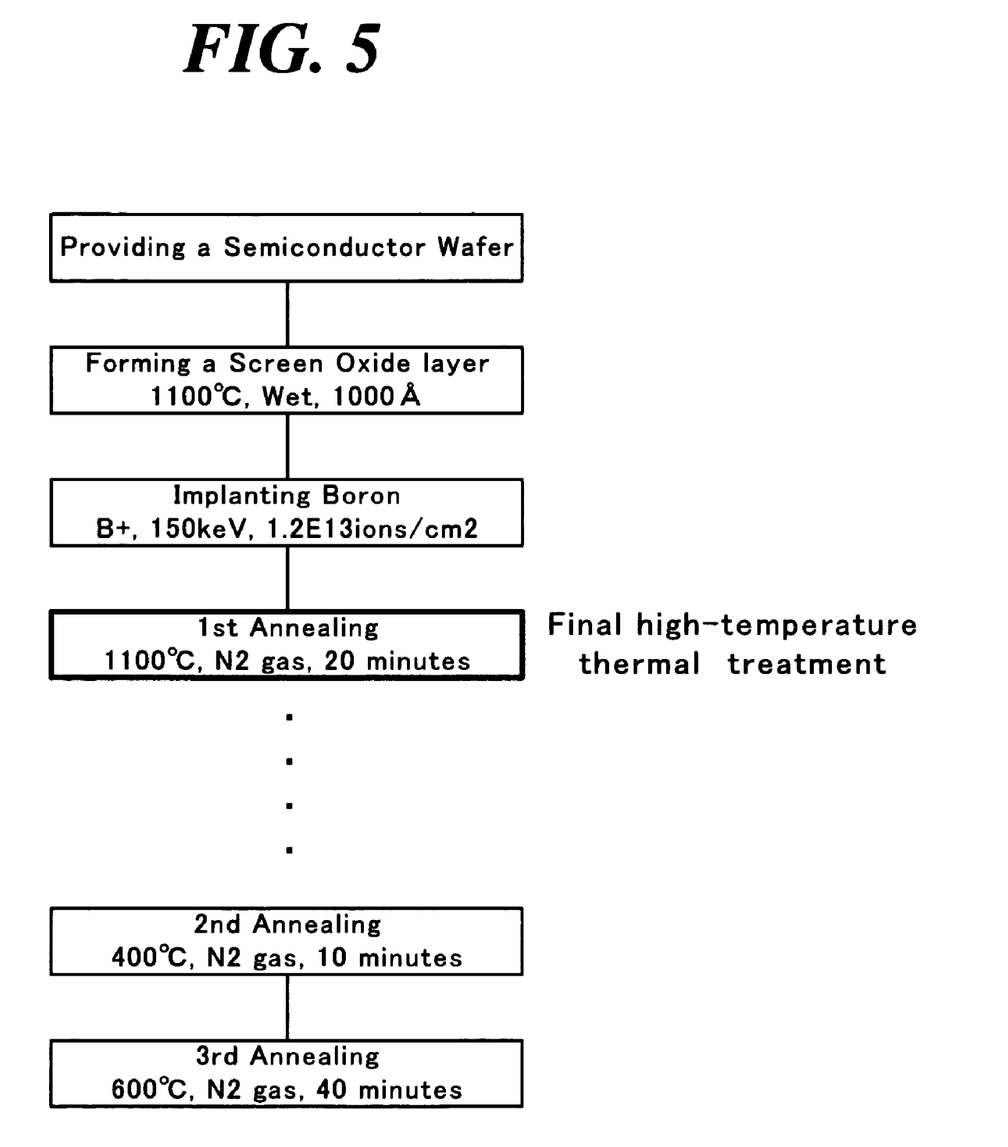
FIG. 5 is a flow chart showing a part of fabrication steps for a semiconductor element according to this invention.
Figure 6:
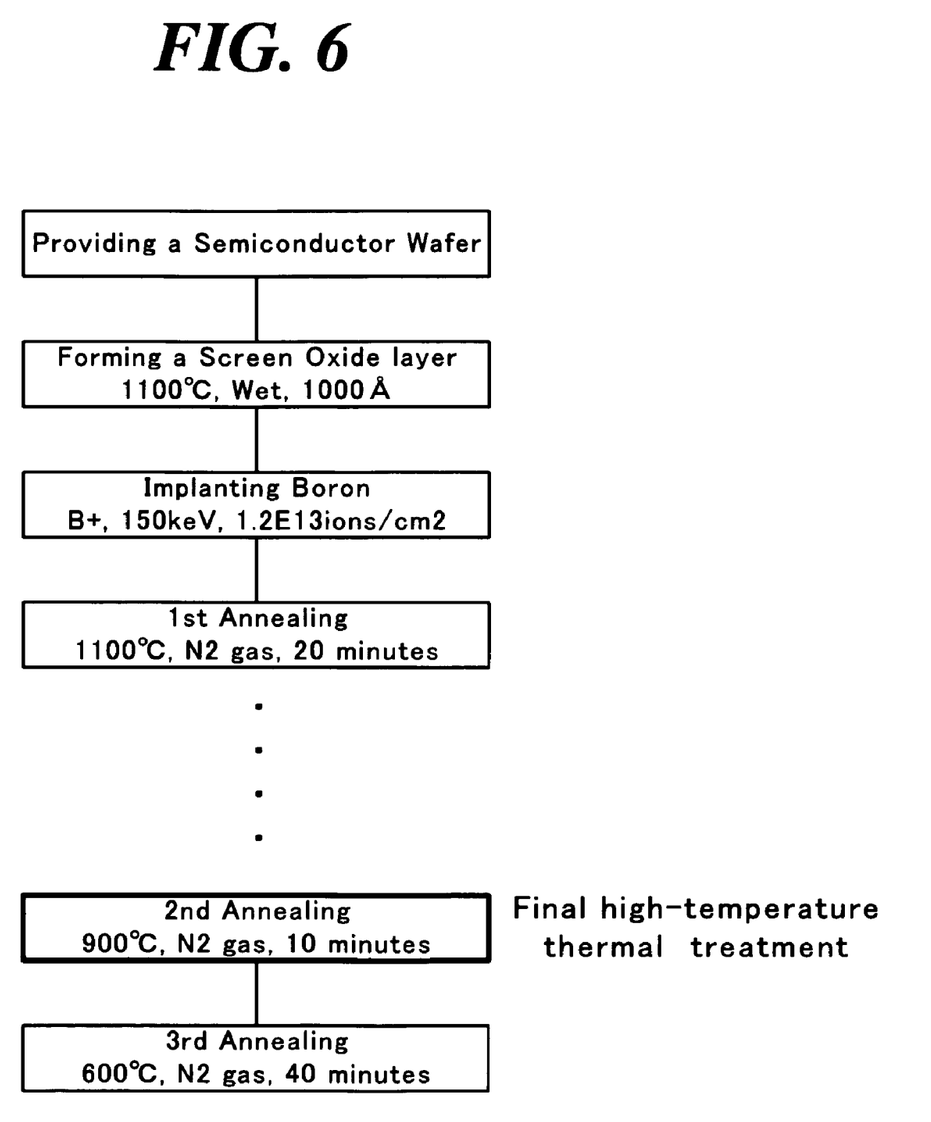
FIG. 6 is a flow chart showing a part of fabrication steps for a semiconductor element according to this invention.

Now, "the final high-temperature treatment" is described in conjunction with FIGS. 5 and 6. "The final high-temperature treatment" means the high-temperature thermal treatment that is performed lastly among all high-temperature thermal treatment(s) at over 700° C. in the process of fabricating a semiconductor element. In the case of FIG. 5, a first annealing step corresponds to the final high-temperature thermal treatment. In the case of FIG. 6, a second annealing step corresponds to the final high-temperature thermal treatment.

Figure 7:
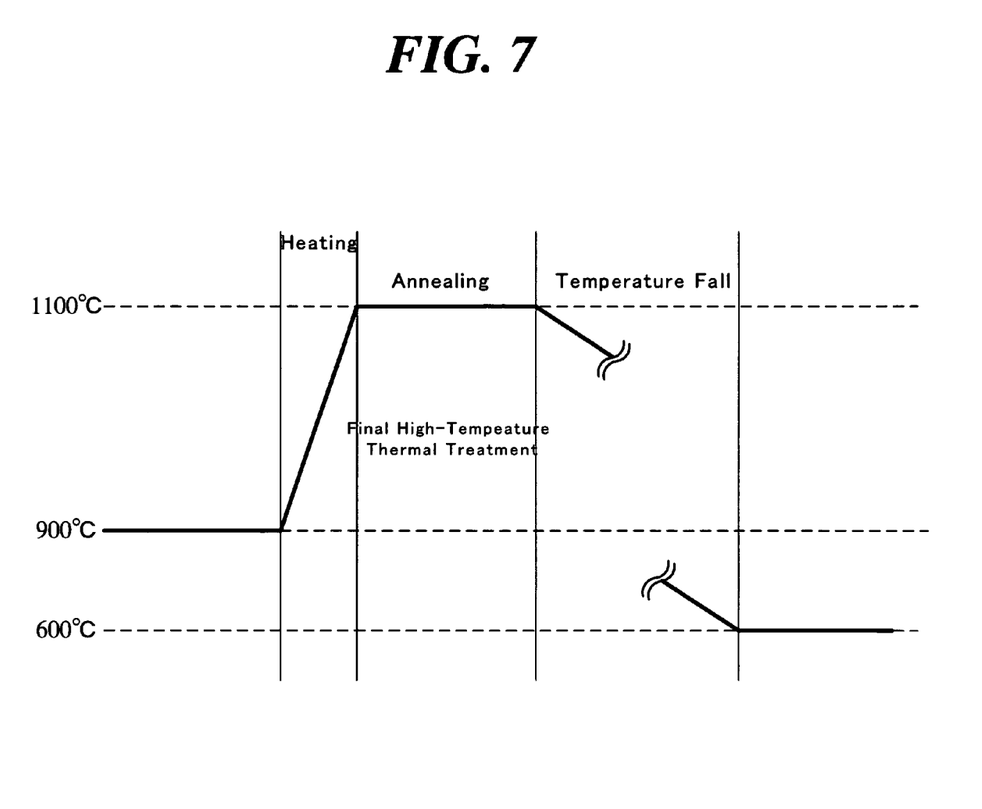
FIG. 7 is a timing chart showing an operation of this invention.

FIG. 7 is a timing chart showing an operation of the final high-temperature thermal treatment according to this invention. Now referring again to FIG. 1, according to an embodiment, firstly the semiconductor wafers 12 are set on the wafer boat 14 in advance. The inside of the quartz tube 16 are heated to 900° C. by controlling the heater 18. Next, the quartz cap 20 is opened and the wafer boat 14 with the semiconductor wafers 12 is inserted in the quartz tube 16. At this time, the wafer boat 14 is inserted to the very end of the quartz tube 16, as shown in FIG. 1. After the loading of the semiconductor wafers 12 is completed, the quartz cap 20 is put onto the opening of the quartz tube 16 to close and seal the quartz tube 16.

Next, the heater 18 is controlled so that the temperature is increased to 1100° C. at a rate of 5° C./minute. Subsequently, annealing treatment (the final high-temperature treatment) is carried out to the semiconductor wafers 12 for 20 minutes. Next, the heater 18 is controlled so that the semiconductor wafers 12 becomes 700 or 600° C. in temperature in an inert gas atmosphere. After that, the quartz cap 20 is removed from the quartz tube 16 and the semiconductor wafers 12 are taken out of the quartz tube 16, so that the semiconductor wafers 12 are unloaded from the furnace 10.

Since the semiconductor wafers 12 have already been lowered in temperature to less than 600° C. when the wafers 12 are unloaded, the amount of electric charge, which is to be trapped at an interface between the silicon surface of the semiconductor wafer and the oxide layer, is restrained effectively.

As described above, according to this invention, a semiconductor element (P-type diffused resistor) having a lower and stable density of electric charge (fixed electric charge) on a semiconductor wafer can be provided without lowering a throughput of fabrication.

According to another embodiment of this invention, the semiconductor wafers 12 are left in the quartz tube 16 after the final high-temperature treatment until the semiconductor wafers 12 becomes lower than 600° C. in temperature without any specific temperature control. In this embodiment, the wafer boat 14 may be moved apart from the heater 18 in the quartz tube 16.

What is claimed is:

1. A method for fabricating a semiconductor element, comprising:

providing a semiconductor wafer;

forming an oxide layer on the semiconductor wafer;

carrying out a high-temperature thermal treatment to the semiconductor wafer at least once, wherein the high-temperature thermal treatment comprises a final high-temperature treatment, which is carried out lastly among all high temperature thermal treatments in a process of fabricating the semiconductor element as the high-temperature thermal treatment and which is carried out in a furnace at a temperature that is over 700° C.;

lowering the temperature of the semiconductor wafer, following the final high-temperature treatment, to a predetermined lower temperature, which is 700° C. or less while in the furnace and in an inert atmosphere consisting essentially of at least one inert gas; and exposing the semiconductor wafer to an oxidizing atmosphere after the temperature lowering process.

2. The method for fabricating a semiconductor element according to claim 1, wherein the high-temperature thermal treatment is carried out plural times.

3. The method for fabricating a semiconductor element according to claim 1, wherein the final high-temperature treatment is carried out at a temperature that is over 1000° C.

4. The method for fabricating a semiconductor element according to claim 1, wherein the predetermined lower temperature is lower than 600° C.

5. The method for fabricating a semiconductor element according to claim 1, wherein the final high-temperature treatment is carried out intentionally to reduce electric charge trapped between the oxide layer and the semiconductor wafer regardless of location of the semiconductor wafer in the furnace.

6. The method for fabricating a semiconductor element according to claim 1, wherein the semiconductor wafer is left in a furnace after the final high-temperature treatment is finished until the semiconductor wafer becomes the predetermined lower temperature without any specific temperature control.

7. The method for fabricating a semiconductor element according to claim 1, wherein the semiconductor element comprises a resistive element.

8. A method for fabricating a resistive element on a semiconductor wafer, comprising:

providing a semiconductor wafer;

forming a screen oxide layer on the semiconductor wafer;

forming a diffusion layer on the semiconductor wafer by a first annealing process;

loading the semiconductor wafer into a furnace;

carrying out a final high-temperature thermal treatment, which is carried out lastly among all high-temperature thermal treatments in a process of fabricating the resistive element as a high-temperature thermal treatment in the furnace and at a temperature that is over 700° C.;

lowering the temperature of the semiconductor wafer in the furnace, following the final high-temperature treatment, to a predetermined lower temperature, which is 700° C. or less, while in the furnace and in an inert atmosphere consisting essentially of at least one inert gas; and unloading the semiconductor wafer from the furnace after the temperature lowering process.

9. The method for fabricating a resistive element on a semiconductor wafer according to claim 8, wherein the high-temperature thermal treatment is carried out plural times.

10. The method for fabricating a resistive element on a wafer according to claim 8, wherein the final high-temperature treatment is carried out at a temperature that is over 1000° C.

11. The method for fabricating a resistive element on a semiconductor wafer according to claim 8, wherein the predetermined lower temperature is lower than 600° C.

12. The method for fabricating a resistive element on a semiconductor wafer according to claim 8, wherein the final high-temperature treatment is carried out intentionally to reduce electric charge trapped between the oxide layer and the semiconductor wafer regardless of location of the semiconductor wafer in the furnace.

13. The method for fabricating a resistive element on a semiconductor wafer according to claim 8, wherein the semiconductor wafer is left in the furnace after the final high-temperature treatment is finished until the semiconductor wafer achieves the predetermined lower temperature without any specific temperature control.

* * * * *